(12) United States Patent
Chung (10) Patent No.: US 7,922,544 B2
(45) Date of Patent: Apr. 12, 2011

(54) POGO PIN, THE FABRICATION METHOD THEREOF AND TEST SOCKET USING THE SAME

(76) Inventor: Un-Young Chung, Gyeonggi-Do (KR)

( * ) Notice: Subject to any disclaimer, the term of this patent is extended or adjusted under 35 U.S.C. 154(b) by 0 days.

(21) Appl. No.: 12/376,675

(22) PCT Filed: Aug. 8, 2007

(86) PCT No.: PCT/KR2007/003807
§ 371 (c)(1),
(2), (4) Date: May 10, 2010

(87) PCT Pub. No.: WO2008/018748
PCT Pub. Date: Feb. 14, 2008

(65) Prior Publication Data
US 2010/0221960 A1    Sep. 2, 2010

(30) Foreign Application Priority Data

Aug. 8, 2006  (KR) .................. 10-2006-0074918

(51) Int. Cl.
*H01R 13/24* (2006.01)
(52) U.S. Cl. ........................................ 439/700
(58) Field of Classification Search .................. 439/700, 439/824, 482; 324/755.05, 755.08
See application file for complete search history.

(56) References Cited

U.S. PATENT DOCUMENTS

| | | | |
|---|---|---|---|
| 4,307,928 A * | 12/1981 | Petlock, Jr. | 439/824 |
| 7,154,286 B1 * | 12/2006 | Marx et al. | 324/755.05 |
| 7,245,138 B2 * | 7/2007 | Jeong et al. | 324/754.08 |

FOREIGN PATENT DOCUMENTS

| | | | |
|---|---|---|---|
| JP | 101890987 | | 7/1998 |
| JP | 2002022768 | | 1/2002 |
| JP | 2004085260 | | 3/2004 |
| KR | 555713 | * | 3/2006 |

OTHER PUBLICATIONS

International Search Report dated Dec. 10, 2007, PCT Appl. No. PCT/KR2007/003807, filed Aug. 8, 2007, serving as the Concise Statement for Japanese Publications JP10189087, JP2002022768, and JP2004085260.
English Abstract of JP10189087, published on Jul. 21, 1998, "Pogo Pin," serving as the Concise Statement of the relevance of JP10189087.
English Abstract of JP2002022768, published on Jan. 23, 2002, "Pogo Pin for Inspecting Integrated Circuit Package," serving as the Concise Statement of the relevance of JP2002022768.
English Abstract of JP2004085260, published on Mar. 18, 2004, "Probe Pin and Contractor," serving as the Concise Statement of the relevance of JP2004085260.

* cited by examiner

*Primary Examiner* — Phuong K Dinh
(74) *Attorney, Agent, or Firm* — Vierra Magen Marcus & DeNiro LLP

(57) ABSTRACT

Disclosed is a pogo pin including: a hollow body having a spring structure by spirally cutting at least a portion of an outer surface thereof; and a conductive material filling at least an inside of the body. According to the present invention, when testing a semiconductor package, error rate in contact between the package, the pogo pin and a test board can be remarkably reduced, and simultaneously can enhance rigidity and electrical conductivity of the pogo pin. Further, simple componentry of the pogo pin can facilitate its fabrication, reduce fabrication costs, and even foresee fabrication of a micro-pogo pin.

12 Claims, 7 Drawing Sheets

POGO PIN, THE FABRICATION METHOD THEREOF AND TEST SOCKET USING THE SAME

CROSS-REFERENCE TO RELATED APPLICATIONS

This application is a national stage of International Application No. PCT/KR2007/003807 filed on Aug. 8, 2007, which claims the priority benefit of Korean Patent Application No. 10-2006-0074918 filed on Aug. 8, 2006.

TECHNICAL FIELD

The present invention relates to a pogo pin, and more particularly, to a pogo pin, which can reduce loose contact and simultaneously can enhance electrical conductivity and rigidity when testing a semiconductor package, and a fabrication method thereof and a test socket using the same.

BACKGROUND ART

The needs of industrial markets for semiconductor devices having characteristics of multi-functions, high-speed operation and low-power consumption have strongly increased. With such needs, among packaged semiconductor devices, a Ball Grid Array (BGA) type which implements a high pin count by forming a plurality of external terminals having a ball shape at a lower surface of a body portion thereof has been favored, rather than a Quad Flat Package (QFP) type which has external terminals protruding toward the outside from side surfaces of the body portion.

Semiconductor devices that have undergone complicated processing are subjected to various types of electrical tests so as to test their characteristics and for defects thereof. To this end, a test socket is used to electrically connect metallic wires or contact pads of a test board (a printed circuit board) mounted in test equipment and external terminals of a device to be tested (a semiconductor package). That is, when testing a semiconductor device, the socket serves as an interface to electrically connect the printed circuit of the test equipment and the semiconductor device under test.

As a trend is driving the BGA type package, test equipment for testing the electrical characteristics of a package is also changing in respect of an appropriate type thereof. For instance, various types of sockets which are electrically connected to the test equipment and capable of being detachably mounted to a package to be tested have been developed and proposed.

Figure 1:
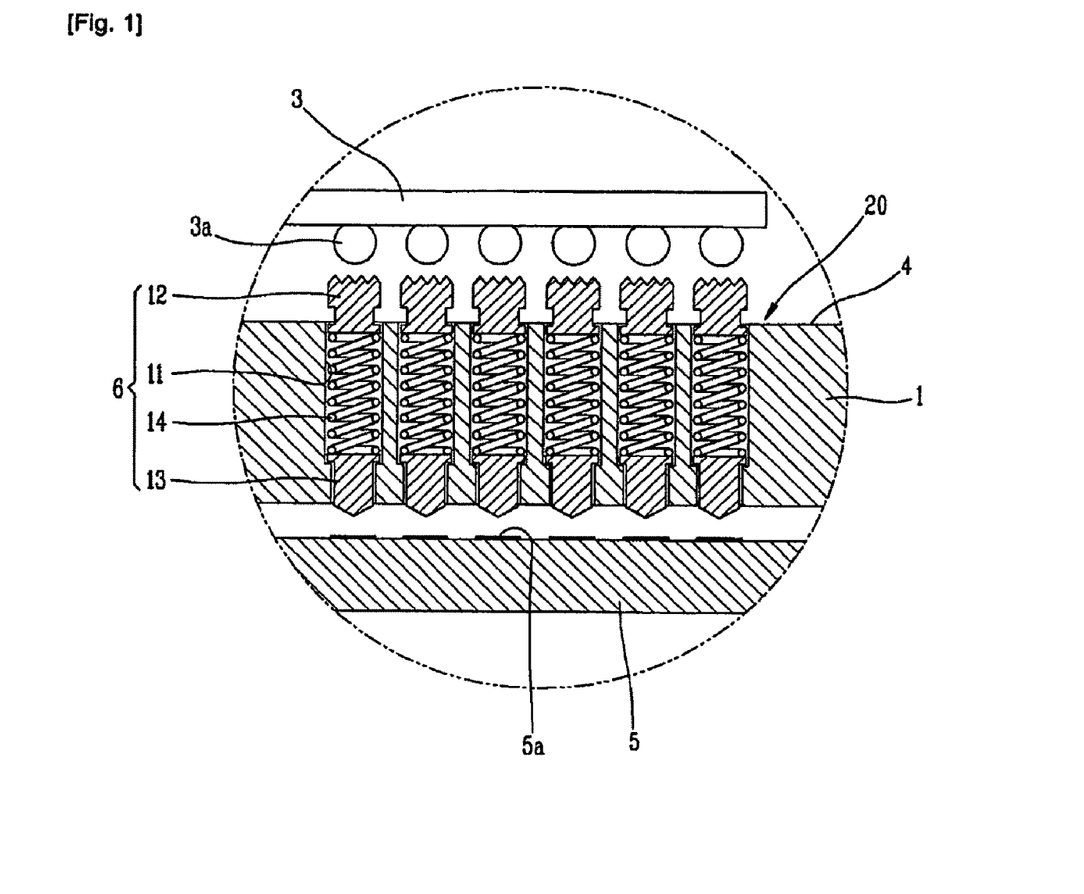
FIG. 1 is a longitudinal cross-sectional view of an exemplary socket for testing a semiconductor package using a pogo pin according to a prior art.

FIG. 1 is a longitudinal cross-sectional view of an exemplary related art socket for testing semiconductor package, showing that a pogo pin is used to connect external terminals of a semiconductor package and metal wiring on a printed circuit board (PCB).

Referring to FIG. 1, the related art socket 20 for testing the semiconductor package includes pogo pins 6 for electrically connecting external terminals 3a of a device to be tested (semiconductor package) and contact pads 5a of a test board 5, and a main body 1 having insulating properties and disposing the pogo pins at predetermined intervals to fix and support the pogo pins to protect against deformation and external physical impact.

The pogo pins 6 include pipe-shaped pin bodies 11, metallic upper contactors 12 coupled to an upper end of the pin bodies 11 and contacting external terminals 3a of the package 3, metallic lower contactors 13 coupled to a lower end of the pin bodies 11 and contacting the contact pads 5a of the test board 5, and coil springs 14 disposed inside the pin bodies 11 so that upper ends make contact with the upper contactors 12 and their lower ends contact with the lower contactors 13, and upon testing, making elastic contacts when the upper contactors 12 contact the external terminals 3a of the package 3 and the lower contactors 13 contact the contact pads 5a of the test board 5.

With these configurations, when the related art semiconductor package testing socket 20 is used to test a semiconductor package, a cover (not shown) of the socket 20 is opened, then the package 3 desired to be tested is mounted inside of a package mounting portion 4 formed in a front surface of the main body 1 of the socket, and then the cover (not shown) is closed. Then, external terminals 3a of the package mounted in the package mounting portion 4, the pogo pins 6 and the contact pads 5a of the test board are contacted to each other, thereby establishing electrical connections therebetween. In this state, tests of electrical characteristics are performed.

However, this related art socket 20 electrically connected by the pogo pins 6 has too many contacts, when testing, where electrical contacts are made between the external terminals 3a of the package and the contact pads 5a of the test board, such as between the external terminals 3a of the package and the upper ends of the upper contactors 12 of the pogo pins, between the lower ends of the upper contactors 12 and the upper ends of the coil springs 14, between the lower ends of the coil springs 14 and the upper ends of the lower contactors 13, and between the lower ends of the lower contactors 13 and the contact pads 5a of the test board. Accordingly, the presence of so many contacts causes unstable impedance and poor high frequency characteristics, thereby reducing the reliability of the test.

In order to solve this problem, in Korean Patent No. 555713, the present applicant disclosed a pogo pin in which a cylindrical metallic body having a hollow inner space therein and a spring structure being cut in a screw thread shape (spiral shape) at least partially on an outer surface of a central portion of the body are integrally formed. When this pogo pin is applied to the socket for testing a semiconductor package shown in FIG. 1, contacts exist only between the external terminals of the package and the upper ends of the pogo pins, and between the lower ends of the pogo pins and the contact pads of the test board. Accordingly, this could result in remarkable reduction in erroneous contacts.

However, the pogo pin disclosed in Korean Patent No. 555713 has implemented a spring structure by spirally cutting a portion of an outer surface of a central portion of the body. Accordingly, mechanical properties such as rigidity, and the like are deteriorated. When the pogo pin is repeatedly used, the original shape of the pogo pin is deformed, thereby causing a problem of loose contact.

Further, since the outer surface portion of the body is spirally cut, the path between the external terminals of the package and the contact pads of the test board becomes long, thereby increasing electric resistance.

DISCLOSURE OF THE INVENTION

Technical Problem

To overcome these problems and in accordance with the purposes of the present invention, as embodied and broadly described herein, there is provided a pogo pin, which can reduce loose contact, and simultaneously can enhance electrical conductivity and rigidity when testing a semiconductor package, and a fabrication method thereof.

Technical Solution

To achieve these and other advantages and in accordance with an aspect of the present invention, there is provided a pogo pin, including: a hollow body having a spring structure by spirally cutting at least a portion of an outer surface thereof; and a conductive material filling at least an inside of the body.

There is also provided a test socket, including: upper and lower main bodies; and a pogo pin inserted into through-holes formed in each of the upper and lower main bodies, and including a hollow body having a spring structure formed by spirally cutting at least a portion of an outer surface thereof and a conductive material filling at least an inside of the body.

There is further provided a fabrication method of a pogo pin, including: preparing a hollow body having a spring structure by spirally cutting at least a portion of an outer surface thereof; inserting the body into a molder; and filling a conductive material inside the body.

EFFECT OF THE INVENTION

The pogo pin according to the present invention has only two electrical contacts, unlike an existing pogo pin, thereby remarkably reducing erroneous contacts, and simultaneously, the body thereof is coupled to the conductive material, thereby enhancing rigidity and electrical conductivity of the body. Further, the simple componentry of the pogo pin can facilitate its fabrication, reduce fabrication cost, and even foresee fabrication of a micro-pogo pin.

MODES FOR CARRYING OUT THE PREFERRED EMBODIMENTS

Description will now be given in detail of the preferred embodiments of the pogo pin according to the present invention.

Figure 2:
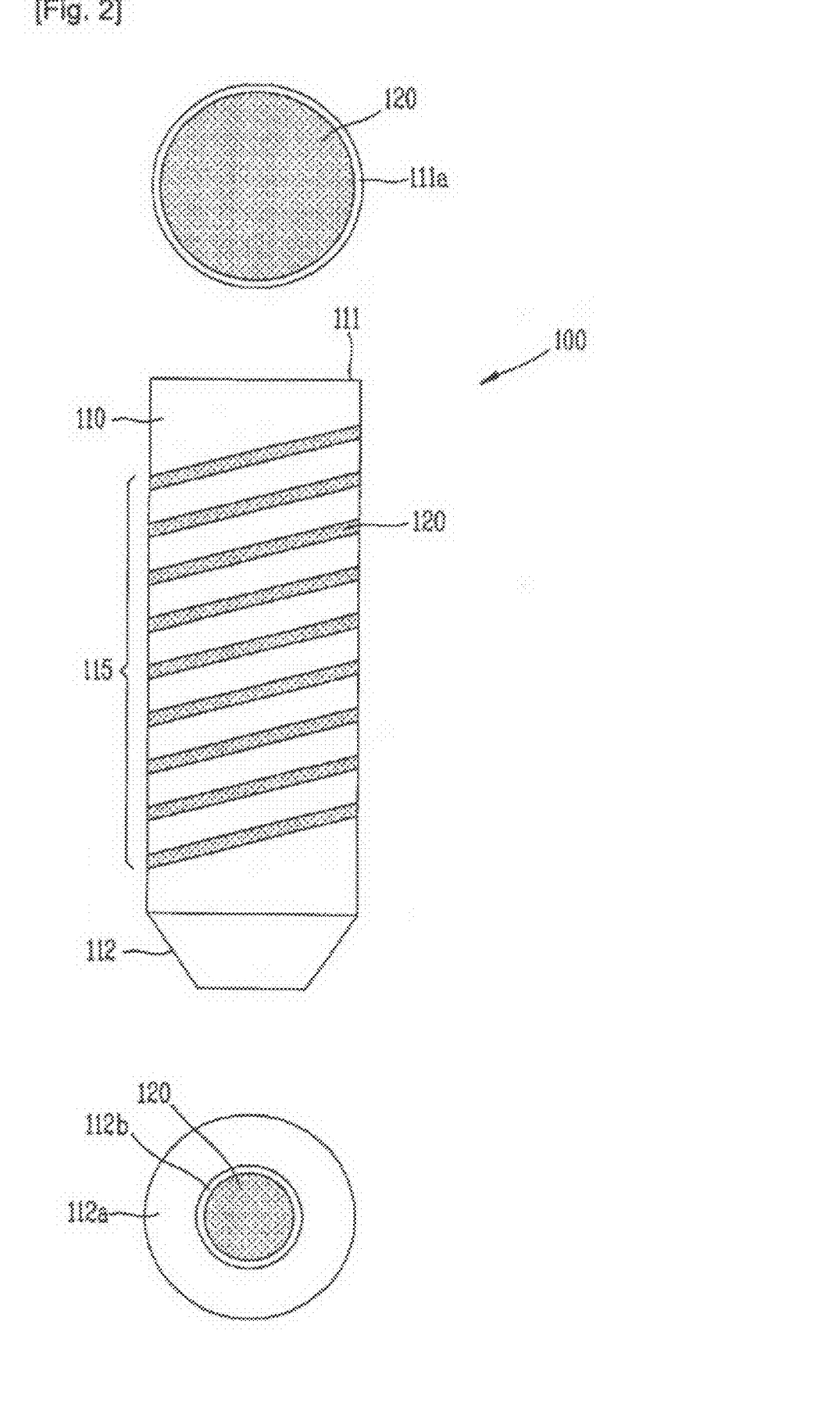
FIG. 2 shows respective plane, front and bottom views of a pogo pin according to one embodiment of the present invention.

Referring to FIG. 2, the pogo pin 100 includes a hollow body 110 having a spring structure by spirally cutting at least a portion of an outer surface thereof, and a conductive material 120 filling at least an inside of the body 110.

The body 110 of the pogo pin according to the present invention takes the shape of a coil spring, since the outer circumferential surface of the hollow cylindrical body, as a metal pipe such as an injector needle, is spirally cut. Accordingly, there is provided a body in which the coil spring of the pogo pin applied to the socket shown in FIG. 1 and the upper/lower contactors are integrally formed. Even though the body 110 in this example is shown as a cylindrical shape, the present invention is not limited to a cylindrical shape.

As shown, an outer surface portion 115 of the body 110 of the pogo pin, except an upper portion 111 and a lower portion 112, is spirally cut. A laser may be used to perform the cutting process for facilitation of the work and precise processing. However, other cutting processing can also be employed. Such outer surface portion 115 is a portion that has elasticity like a spring or a coil, and provides the pogo pin 100 itself with elasticity against an external pressure. The length of the outer surface portion 115 of the spring structure or its cutting interval may vary according to the purposes of the test equipment to be used.

The upper portion 111 of the body 110 refers to one end of a simple cylinder having a hollow inner space therein and may have a flat end 111a. Alternatively, the upper portion 111 of the body 110 may be formed to have peaks and valleys (referring to FIG. 6) so as to facilitate contact with the external terminals of the package. That is, this is to prevent loose contact with the body, while testing, even when a degree of flatness of the end is not uniform or when a height or an interval of the external terminals of the package according to the device is not uniform.

The lower portion 112 of the body 110 may have an inwardly tapered portion so as to secure contact reliability with the metallic wires or the contact pads of the test board. With this shape, a contact portion 112a has a relatively larger area and the area of an inner empty space 112b is somewhat reduced.

Preferably, since the body 110 is an electrical connection portion, if possible, a material having a low resistance is used, and a metallic material having excellent electrical conductivity, such as Al, Cu, Ag, Pt, Au, and the like may also be used.

Figure 3:
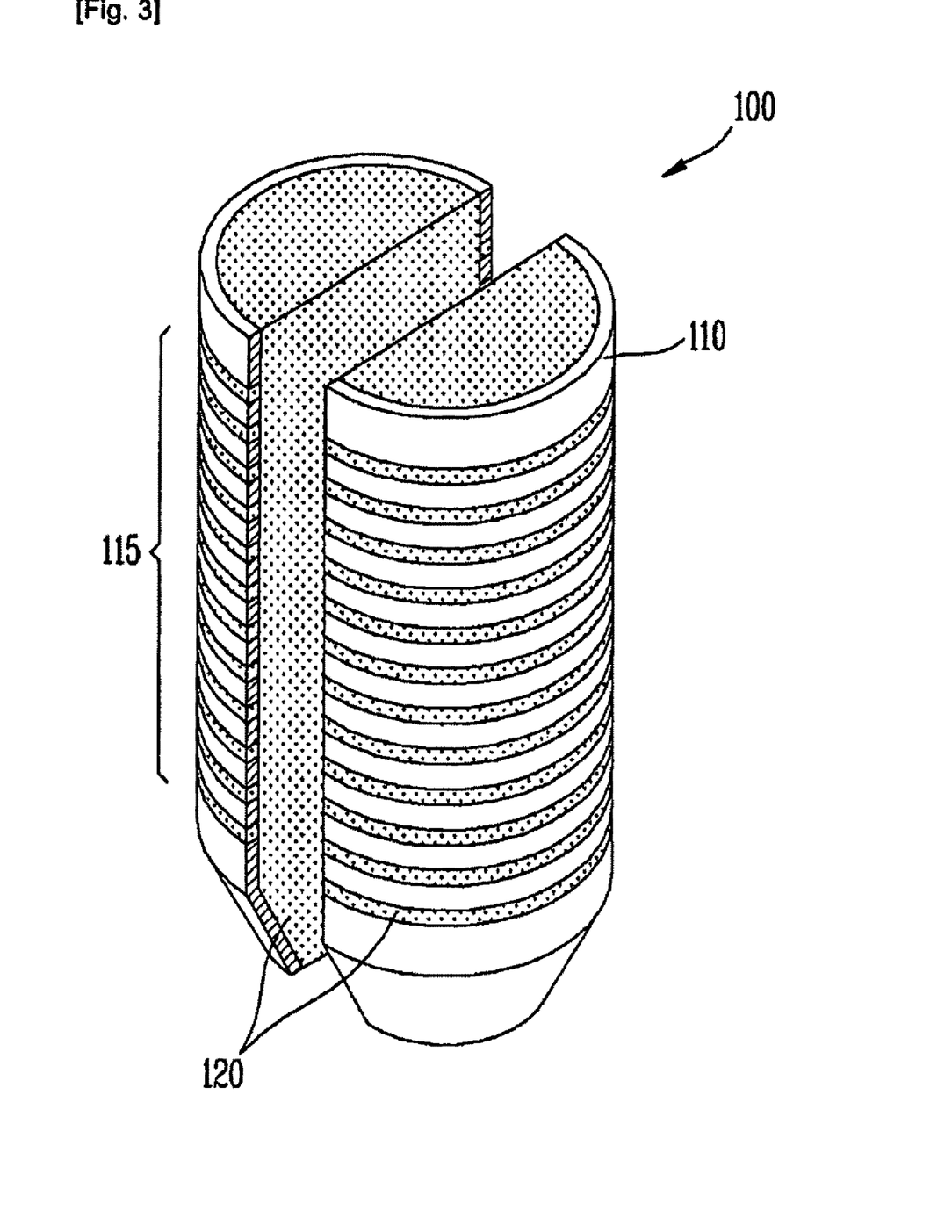
FIG. 3 is a perspective view illustrating the pogo pin shown in FIG. 2 separated by cutting in a lengthwise direction.

Meanwhile, referring to FIG. 3, the conductive material 120 fills at least an inside of the body 110 of the pogo pin 100 according to the present invention. The term "at least" as used here indicates that the conductive material 120 may fill only the inside of the body 110. The conductive material 120, as shown in FIG. 3, may be filled in the portion spirally cut on the body 110 as well as inside the body 110. This serves to strengthen the rigidity of the body 110. In this case, the conductive material 120 may preferably have elasticity. Further, the conductive material 120 may form a protruding portion by coupling to the outer surface portion 115 of the body 110, as will be described later (referring to FIG. 6).

The outer surface portion 115 of the body of the pogo pin is spirally cut, thereby reducing its mechanical properties, such as rigidity and the like. Accordingly, when the pogo pin is repeatedly used, the original shape of the pogo pin can be deformed, along with the possibility of causing loose contact. In addition, since the outer surface portion of the body is spirally cut, the path between the external terminals of the package and the contact pads of the test board becomes long, thereby increasing the electrical resistance.

In order to solve the above-mentioned problems, the present invention fills the conductive material 120 inside the body 110 of the pogo pin. Here, preferably, the conductive material may have such elasticity that the elasticity due to the spring structure of the outer surface portion 115 of the pogo pin body cannot be suppressed. Therefore, a conductive elastic rubber (e.g., conductive silicon rubber) may be used as the conductive material. Further, metal powder having excellent electrical conductivity may be added to the conductive material to enhance conductivity.

Preferably, in order to enhance the electrical conductivity and rigidity of the pogo pin, an upper end of the conductive material 120 is formed so as to contact the external terminals of the semiconductor package to be tested. And, preferably, a lower end of the conductive material 120 is formed to contact the metallic wires or contact pads of the circuit board.

In particular, the pogo pin according to the present invention has only two electrical contacts, unlike the existing pogo pins, thereby remarkably reducing erroneous contacts, and simultaneously, the body thereof is coupled to the conductive material, thereby enhancing the rigidity and electrical conductivity of the body.

Further, as semiconductor devices become smaller in size, the spaces between the lead pins or balls (in the BGA case) of the packages are narrower. Accordingly, the size and length of the pogo pin are gradually miniaturized, shaped as an extremely fine needle having a diameter of less than 1 mm, for instance, even a diameter of 0.35 mm. With this trend, if the upper/lower contactors, coil spring and a pin body are to form one pogo pin as in the prior art, the sizes of each of the components would be too small to fabricate. Besides, it is difficult to assemble each of the components into one pogo pin.

According to the present invention, a coil spring shape can be formed even in an outer circumferential surface of a cylindrical tube having a diameter of less than 0.1 mm, then the conductive material can be filled inside the body according to the method to be described later. Accordingly, there is no need to fabricate micro components, and there is no difficulty in assembling the micro components into one assembly, thereby reducing the manufacturing cost. A laser processing enables a cutting even in a minute interval of 0.025 mm, thereby foreseeing fabrication of a micro-pogo pin.

Meanwhile, since the outer surface portion 115 of the body of the pogo pin 100 has a spiral spring structure, when the pogo pin is coupled with the upper main body and/or lower main body for receiving the pogo pin, the coupling state can be maintained by friction without a separate coupling means. However, if the size of the pogo pin is very fine and more precise testing is required, there is a need to fix the coupling state between the pogo pin and the main body for receiving the pogo pin as well as its coupling location. In this case, a pogo pin having the following modified shape would be desired.

Figure 4:
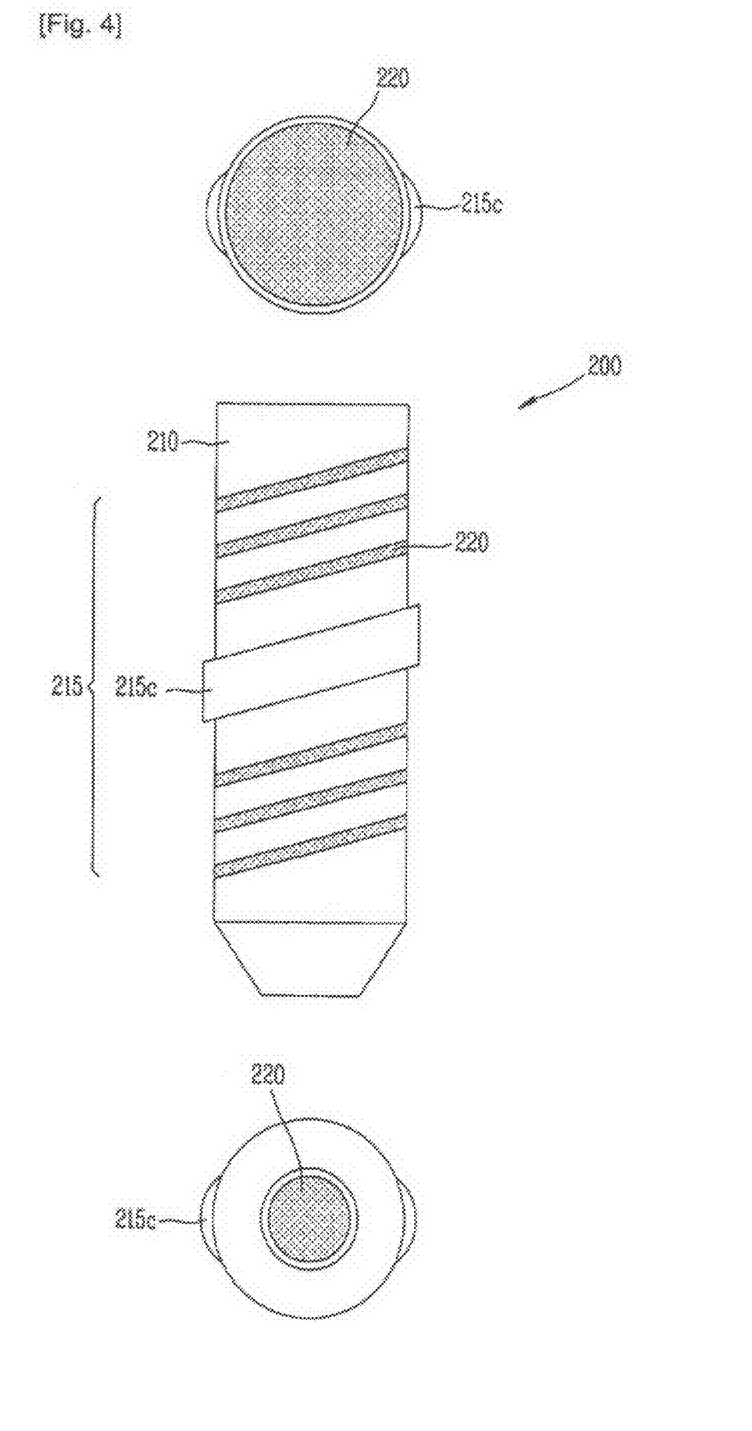
FIGS. 4 through 6 show respective plane, front and bottom views of a pogo pin according to another embodiment of the present invention.

The example in FIG. 4 shows that, similar to that in FIG. 2, an outer surface portion 215 of a cylindrical pogo pin body 210 is spirally cut by laser cutting. However, a central portion 215c of the outer surface portion 215 of the body protrudes laterally. Such protruding portion is to couple with the main body of the test socket for receiving the pogo pin and/or to fix the location of coupling. This protruding portion may be formed by laterally pressing the central portion of the body.

Figure 5:
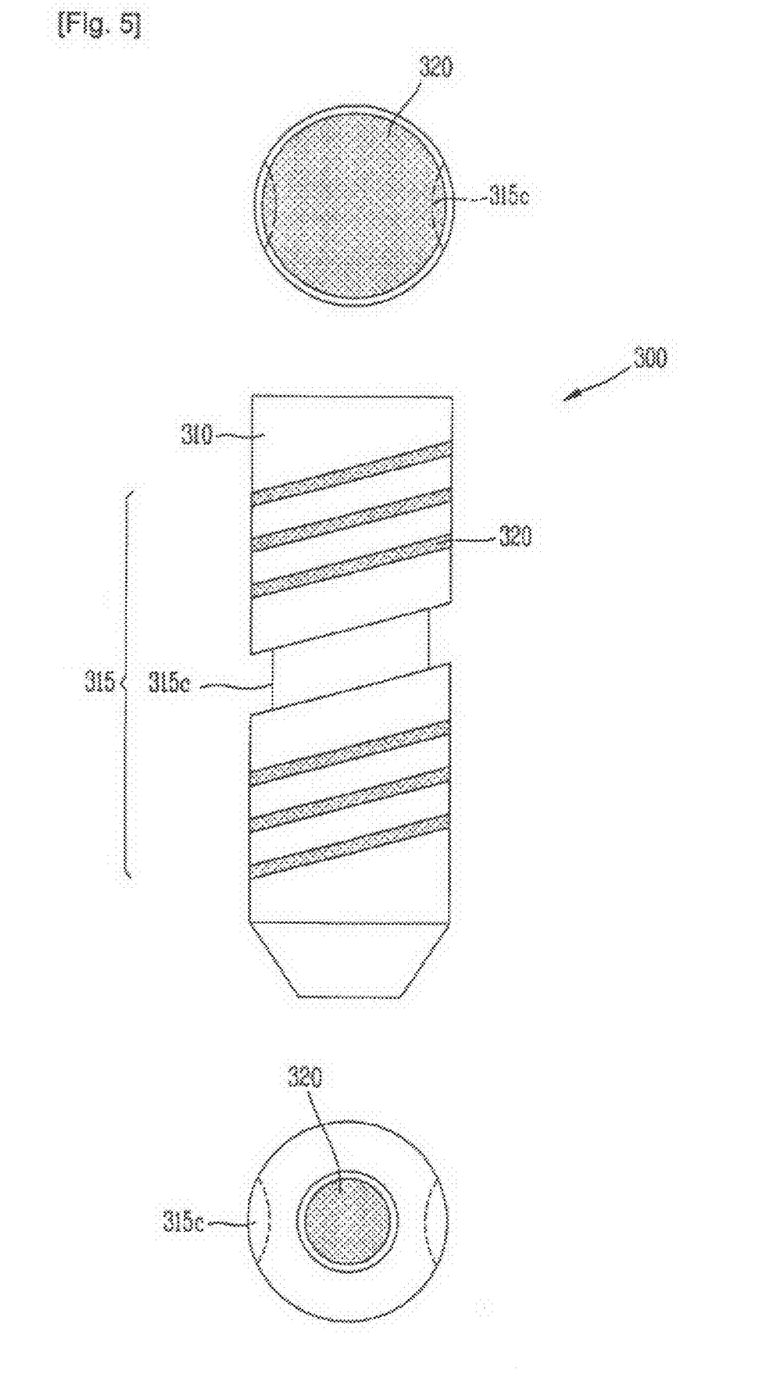

Further, the example in FIG. 5 shows that, similar to that in FIG. 2, an outer surface portion 315 of a cylindrical pogo pin body 310 is spirally cut by laser cutting. However, a central portion 315c of the outer surface portion 315 of the body is laterally indented. Such indented portion is to couple with the main body of the test socket for receiving the pogo pin and/or to fix the location of coupling. This indented portion may be formed by pressing toward the inside of the body.

Figure 6:
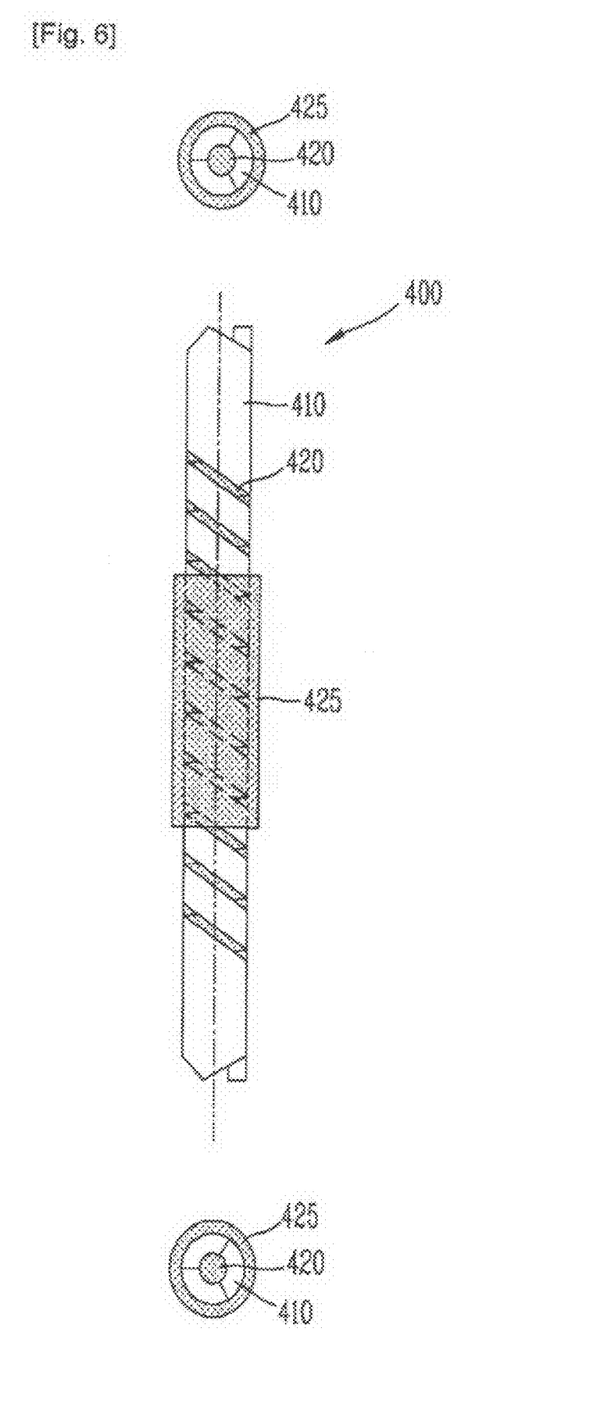

Further, the example in FIG. 6 shows that, similar to that in FIG. 2, an outer surface portion of a cylindrical pogo pin body 410 is spirally cut by laser cutting. Upper and lower end portions of the body 410 have peaks and valleys so as to facilitate respective contacts with external terminals of a package and a test board. A conductive material 420 is filled in the portion spirally laser-cut on the body 410 as well as inside the body 410. Further, in this example, unlike in the above-described examples, the conductive material 420 forms a protruding portion coupled to the outer surface of the body 410. This protruding portion 425 is to couple with the main body of the test socket for receiving the pogo pin 400 and/or to fix the location of coupling. The protruding portion 425 may be formed of another material, separately from the conductive material 420. However, in order to save fabrication time and cost, it is preferable that the protruding portion 425 is formed of the conductive material 420. A method for forming the protruding portion 425 will be described later.

Figure 7:
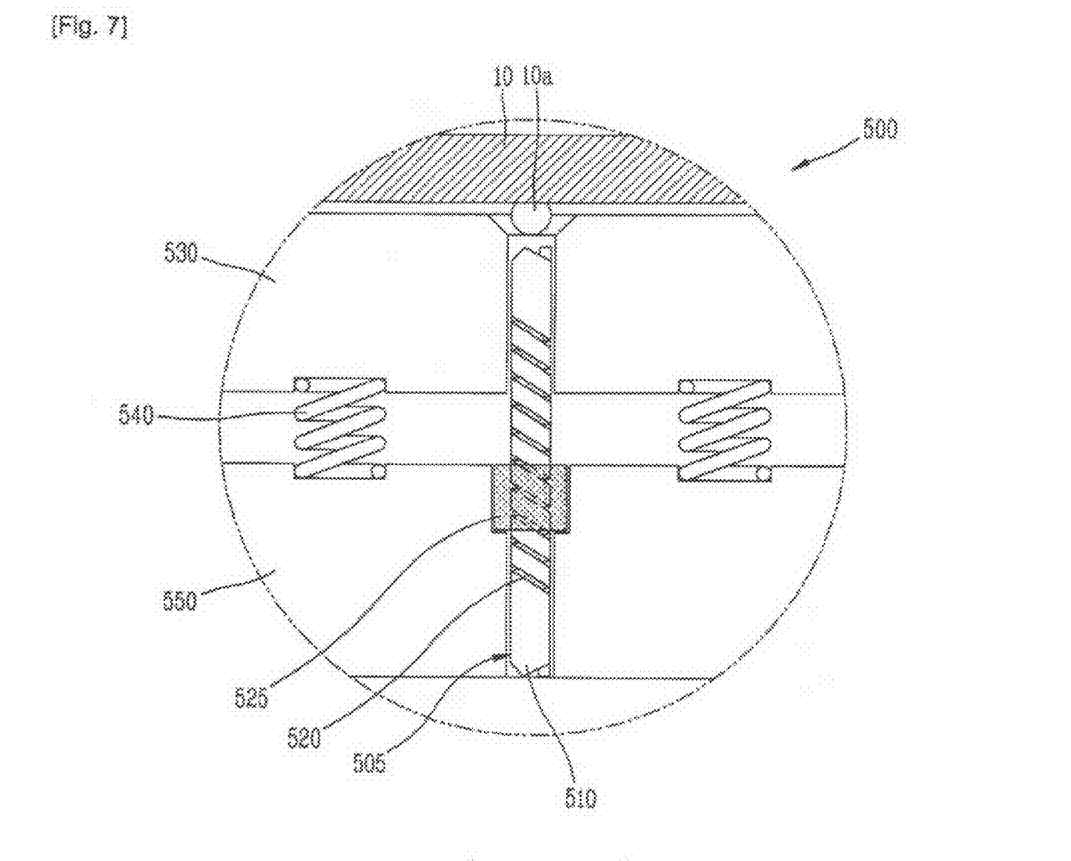
FIG. 7 is a front cross-sectional view of an exemplary test socket according to the present invention.

Meanwhile, referring to FIG. 7, the test socket 500 of the present invention includes a pogo pin 505, and an upper main body 530 and a lower main body 550 for receiving the pogo pin 505.

The upper main body 530 and the lower main body 550 are coupled through a plurality of springs 540. If a semiconductor package 10 is safely mounted while being pressed downwardly from above the upper main body 530, due to the elasticity of the springs 540, the distance between the upper main body 530 and the lower main body 550 becomes shorter. With such a structure, the external terminal 10a of a miniaturized and high pin count package can be easily located at the upper end of the corresponding pogo pin 505 to make a contact.

The pogo pin 505 is inserted into through-holes formed in the upper main body 530 and the lower main body 550. The pogo pin 505 includes a hollow body 510 having a spring structure by spirally cutting at least a portion of its outer surface, and a conductive material 520 filling at least an inside of the body.

In addition, a protruding portion or an indented portion, even though not shown, may be formed at a central portion of the outer surface of the body 510 such that the coupling state of the pogo pin 505 with the main bodies 530 and/or 550 receiving the pogo pin 505, and/or the location of coupling can be fixed. For the same reason, as shown in FIG. 7, a protruding portion 525 is formed by coupling the conductive material 520 to the outer surface portion of the body 510, and a stopping shoulder 552 is formed at the lower main body 550 such that the protruding portion 525 may not pass through the through-hole formed in the lower main body 550. In this case, a top surface of the protruding portion 525 is stopped by a lower surface of the upper main body 530 having a through-hole of a smaller area, thereby not passing through the through-hole formed in the upper main body 530. Here, the stopping shoulder 552 may be formed at the upper main body 530, or may be formed at both the upper and lower main bodies 530 and 550. Further, the protruding portion 525 may be fixed to the stopping shoulder 552 which is formed at the upper 530 or lower 550 main bodies in a fitting manner.

Hereinafter, description of the fabrication method of the pogo pin according to the present invention will be given in detail.

First, a hollow body having a spring structure formed by spirally cutting at least a portion of its outer surface is prepared. A laser may be used to perform the cutting process for facilitation of the work and precise processing. However, other cutting processes can also be employed. The length of the cut portion of the spring structure or its cutting interval may vary according to the purposes of the test equipment to be used.

Next, the prepared body is inserted into a molder. The molder may include an upper and a lower molder. An inner space formed by contacting the upper and the lower molder to each other may be formed accurately complementary to an outer shape of the prepared pogo pin body, or an additional recess may be formed at a corresponding location of the molder so as to form the protruding portion of the pogo pin to be applied to the test socket as shown in FIG. 7.

Then, a conductive material is filled inside the body. There are various possible examples for the method for filling the conductive material inside the body of the pogo pin. For instance, a runner may be formed to communicate with a location corresponding to the inside of the pogo pin body among the space formed inside the upper or lower molders. Through the runner, a conductive resin solution is injected and then hardened. As another method, a conductive film or conductive paste is disposed at the outside of the body, and is then pressurized toward the body such that the conductive film or conductive paste may penetrate through the gaps of the portion spirally cut among the body.

The foregoing embodiments and advantages are merely exemplary and are not to be construed as limiting the present invention. Many alternatives, modifications, and variations will be apparent to those skilled in the art.

The invention claimed is:

1. A pogo pin, comprising;
   a hollow body having a spring structure by spirally cutting at least a portion of an outer surface thereof; and
   a conductive material filling at least an inside of the body.

2. The pogo pin of claim 1, wherein the body is formed in a cylindrical shape.

3. The pogo pin of claim 1, wherein a central portion of the body is either protruded or indented.

4. The pogo pin of claim 1, wherein the body is formed of a metallic material.

5. The pogo pin of claim 1, wherein the conductive material is an elastic rubber material.

6. The pogo pin of claim 1, wherein a metallic powder is added into the conductive material.

7. The pogo pin of claim 5, wherein the conductive material is filled inside the body and in the portion spirally cut on the body.

8. The pogo pin of claim 7, wherein the conductive material forms a protruding portion coupled to an outer surface of the body.

9. The pogo pin of claim 1, wherein the conductive material forms a protruding portion coupled to an outer surface of the body.

10. A test socket, comprising:
    upper and lower main bodies; and
    a pogo pin inserted into through-holes formed in each of the upper and lower main bodies, and including a hollow body having a spring structure formed by spirally cutting at least a portion of an outer surface thereof and a conductive material filling at least an inside of the body.

11. The test socket of claim 10, wherein the upper main body is coupled to the lower main body by a spring.

12. The test socket of claim 10, wherein a protruding portion is formed by coupling the conductive material to the outer surface of the body, and a stopping shoulder is formed in at least one of the upper main body or the lower main body such that the protruding portion cannot pass through the through holes formed in the upper and lower main bodies.

* * * * *